(12) United States Patent
Mallick et al.

(10) Patent No.: US 7,825,044 B2
(45) Date of Patent: Nov. 2, 2010

(54) CURING METHODS FOR SILICON DIOXIDE MULTI-LAYERS

(75) Inventors: Abhijit Basu Mallick, Palo Alto, CA (US); Srinivas D. Nemani, Sunnyvale, CA (US); Timothy W. Weidman, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/817,840

(22) Filed: Jun. 17, 2010

(65) Prior Publication Data

US 2010/0255655 A1 Oct. 7, 2010

Related U.S. Application Data

(62) Division of application No. 11/845,445, filed on Aug. 27, 2007, now Pat. No. 7,745,352.

(51) Int. Cl.
*H01L 21/31* (2006.01)
*H01L 21/489* (2006.01)

(52) U.S. Cl. ...................................... 438/789; 438/790

(58) Field of Classification Search .................. 438/730
See application file for complete search history.

(56) References Cited

U.S. PATENT DOCUMENTS

| 2004/0152342 A1* | 8/2004 | Li et al. ...................... 438/789 |
| 2004/0180557 A1* | 9/2004 | Park et al. ................... 438/787 |
| 2007/0026689 A1* | 2/2007 | Nakata et al. ............... 438/781 |

\* cited by examiner

*Primary Examiner*—Ha Tran T Nguyen
*Assistant Examiner*—Valerie Brown
(74) *Attorney, Agent, or Firm*—Townsend and Townsend and Crew

(57) ABSTRACT

Methods of curing a silicon oxide layer on a substrate are provided. The methods may include the processes of providing a semiconductor processing chamber and a substrate and forming an silicon oxide layer filling a portion of a trench on the substrate, the silicon oxide layer including carbon species as a byproduct of formation. The methods also include introducing an acidic vapor into the semiconductor processing chamber, the acidic vapor reacting with the silicon oxide layer to remove the carbon species from the silicon oxide layer. The methods may further include depositing additional silicon oxide over the cured silicon oxide to fill the trench. The methods may also include removing the acidic vapor from the semiconductor processing chamber.

20 Claims, 10 Drawing Sheets

CURING METHODS FOR SILICON DIOXIDE MULTI-LAYERS

CROSS-REFERENCES TO RELATED APPLICATIONS

This application is a divisional of U.S. patent application Ser. No. 11/845,445, filed Aug. 27, 2007, entitled "CURING METHODS FOR SILICON DIOXIDE THIN FILMS DEPOSITED FROM ALKOXYSILANE PRECURSOR WITH HARP II PROCESS", (the "parent application") which is incorporated hereby by reference for all purposes. The parent application is related to co-assigned U.S. patent application 60/803,493, by Ingle et al, and titled "CHEMICAL VAPOR DEPOSITION OF HIGH QUALITY FLOW-LIKE SILICON DIOXIDE USING A SILICON CONTAINING PRECURSOR AND ATOMIC OXYGEN", filed on May 30, 2006. This application is also related to co-assigned U.S. patent application 11/876,541, by Munro et al, and titled "CHEMICAL TREATMENTS FOR IMPROVEMENT OF OXIDE FILM QUALITY." This application is additionally related to co-assigned U.S. patent application Ser. No. 11/876,538, by Mallick et al, and titled "HIGH QUALITY SILICON OXIDE FILMS BY REMOTE PLASMA CVD FROM DISILANE PRECURSORS." The entire contents of both related applications is hereby incorporated by reference for all purposes.

BACKGROUND OF THE INVENTION

Gaps and trenches such as shallow trench isolation structures (STIs) are commonly employed to electrically isolate elements on semiconductor devices. An STI may include a trench or gap formed in an isolation region of a semiconductor substrate that is filled with a dielectric material to hinder the electrical coupling of nearby device structures (e.g., transistors, diodes, etc.). As the device density on integrated circuits continues to increase, the size and distance between device structures is decreasing. However, the vertical heights of the STIs normally do not decrease as fast as their horizontal widths, resulting in gaps and trenches with larger ratios of height to width (i.e., higher the aspect ratios).

While the ability to make device structures with increasing aspect ratios allows more of the structures (e.g., transistors, capacitors, diodes, etc.) to be packed onto the same surface area of a semiconductor chip substrate, it has also created fabrication problems. One of these problems is the difficulty of completely filling the gaps and trenches in these structures without creating a void or seam during the filling process. Filling gaps and trenches with dielectric materials like silicon oxide is necessary to electrically isolate nearby device structures from each other to minimize electrical noise and current leakage. As aspect ratios increase, it becomes more difficult to fill deep narrow trenches without creating a void or seam in the dielectric material that fills the trench.

Voids and seams in a dielectric layer cause problems both during semiconductor device fabrication and in the finished devices. The voids and seams are formed randomly in the dielectric material and have unpredictable sizes, shapes, locations and densities. This results in unpredictable and inconsistent post-deposition processing of the layer, such as uneven etching, polishing, annealing, etc. The voids and seams in the finished devices also create variations in the dielectric qualities of gaps and trenches in device structures. This can result in erratic and inferior device performance due to electrical crosstalk, charge leakage, and in some instances, shorting within the device, among other problems.

Techniques have been developed to minimize the formation of voids and seams during deposition of dielectric materials on high aspect ratio structures. These include slowing the deposition rate of the dielectric material so it stays more conformal to the sidewalls and bottom of the trench. A more conformal deposition can reduce material buildup at the top of the trench and the chance of dielectric material prematurely sealing off the top of the trench to form a void (a problem sometimes referred to as "breadloafing"). Unfortunately however, slowing the deposition rate also means increasing the deposition time, which reduces processing efficiency and production rates.

Another technique to control void formation is to increase the flowability of the deposited dielectric material. A material with more flowability can more quickly fill a void or seam and prevent it from becoming a permanent defect in the fill volume. For example, highly flowable spin-on-glass (SOG) precursors like polysilazanes (PSZs), hydro-silsesquioxanes (HSQs), etc., were conventionally employed for filling trenches with good conformality. However, increasing the flowability of an silicon oxide dielectric material by such conventional SOG films often results in an as-deposited film with low film density caused by residual carbon and silanol groups. One approach to increased film densification is to use high-temperature annealing when curing the SOG film into a silicon oxide film. However, the high-temperature annealing used to remove residual carbon and OH groups may also cause a considerable degree of volumetric shrinkage of film. In narrow trenches for STI applications, the as-deposited films are constrained and unable to shrink, resulting low density films with porous or void containing structures.

Thus, there remains a need for processes that increase the quality of dielectric films in the trenches, gaps, and other device structures with high aspect ratios and also achieve void-free gapfills. These and other aspects of dielectric film deposition are addressed by the present invention.

BRIEF SUMMARY OF THE INVENTION

Embodiments of the present invention include methods of curing a silicon oxide layer on a substrate. The methods may include the processes of providing a semiconductor processing chamber and a substrate and forming an silicon oxide layer overlying at least a portion of the substrate. The silicon oxide layer may include carbon species as a byproduct of formation. The methods may also include introducing an acidic vapor into the semiconductor processing chamber, the acidic vapor reacting with the silicon oxide layer to remove the carbon species from the silicon oxide layer. The methods may also include removing the acidic vapor from the semiconductor processing chamber.

Embodiments of the present invention may also include methods of forming a silicon oxide layer on a substrate. The methods may include providing a semiconductor processing chamber and a substrate and forming a trench within the substrate. The methods may also include depositing a first silicon oxide layer to partially fill the trench and curing the first silicon oxide layer by introducing an acidic vapor into the semiconductor processing chamber, the acidic vapor reacting with the first silicon oxide layer to remove carbon species from the first silicon oxide layer. Furthermore, the methods may also include depositing a second silicon oxide layer overlying the first silicon oxide layer, the second silicon oxide layer substantially filling the trench and annealing the first and the second silicon oxide layers.

Embodiments of the present invention may still further include methods of forming a silicon oxide layer on a substrate. The methods may include (a) providing a substrate and a semiconductor processing chamber and (b) forming a trench within the substrate. The methods may also include (c) depositing a silicon oxide layer within the trench and (d) curing the silicon oxide layer by introducing an acidic vapor into the semiconductor processing chamber, the acidic vapor reacting with the silicon oxide layer to remove carbon species from the silicon oxide layer. The methods may also include (e) repeating processes (c) and (d) until a desired thickness of silicon oxide is formed within the trench; and (f) annealing the silicon oxide layers.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

Systems and methods are described for curing a silicon layer with high flowability using an acidic catalyst to complete reactions in the as-deposited layer. Unwanted, residual species such as unreacted carbon groups present as a byproduct of the silicon layer deposition process can be removed from the silicon layer by curing the as-deposited silicon layer with an acidic catalyst. The catalyst aids in the removal of the unreacted carbon groups by helping to complete reactions in the as-deposited layer. The curing process allows for dense silicon oxide films having an improved wet etch ratio and gap fill capability for high aspect ratio trenches.

The methods of the invention include generating the acidic catalyst as an acidic, aqueous vapor. The acidic catalyst may be introduced directly into the semiconductor processing chamber as a gas such as hydrogen chloride (HCl) or generated in situ by using different precursors such as chlorosiloxane or acetoxy-siloxane. The addition of the acid into the semiconductor processing chamber catalyzes the reaction of any unreacted organic moieties in the as-deposited layer at a low-temperature, allowing for densification of the layer before it completely solidifies. A subsequent anneal process can be used to fully densify the layer at high temperatures.

Figure 1A:
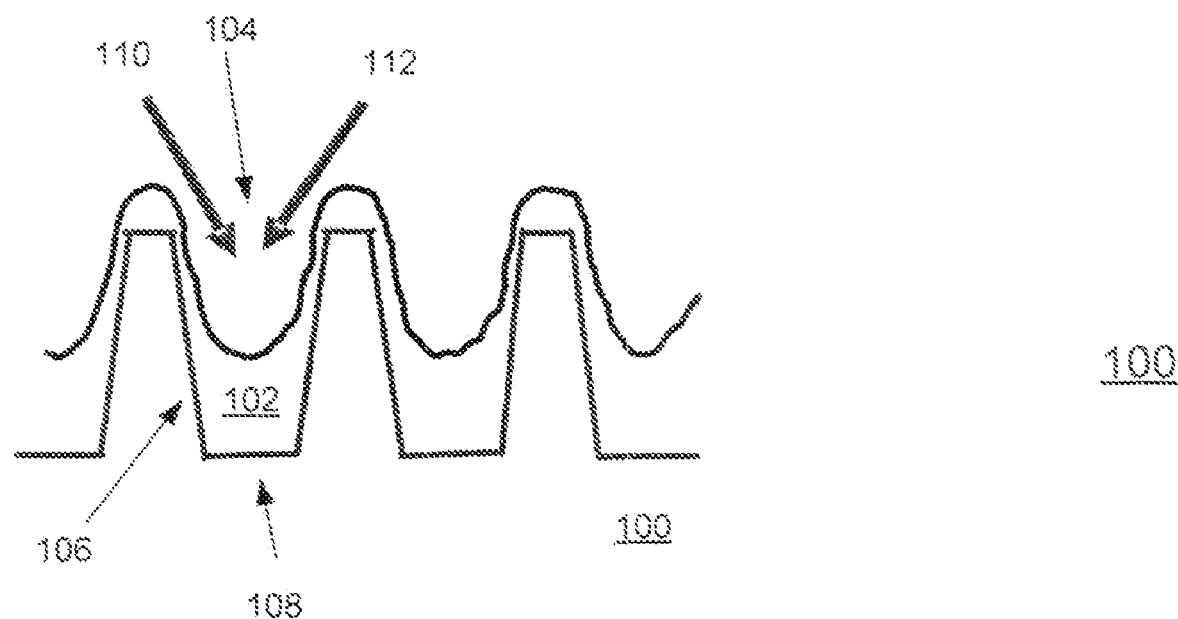
FIGS. 1A-1B are simplified exemplary cross-sections showing a series of processes used in a gap-fill deposition according to an exemplary embodiment of the present invention.
Figure 1B:
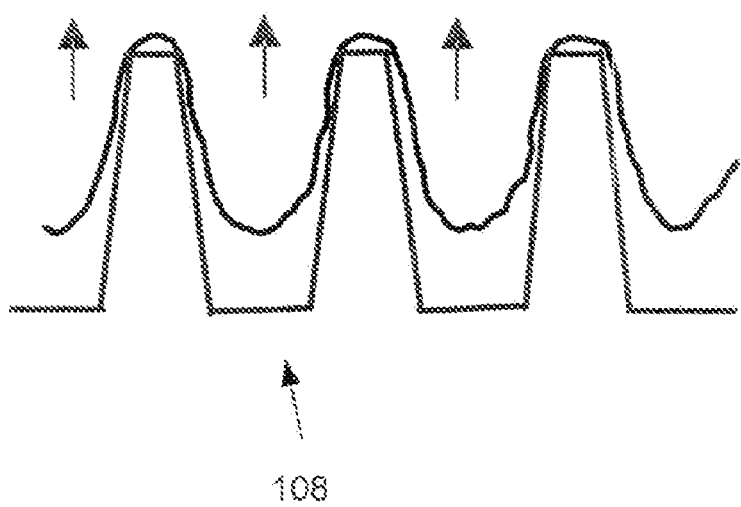
Figure 2:
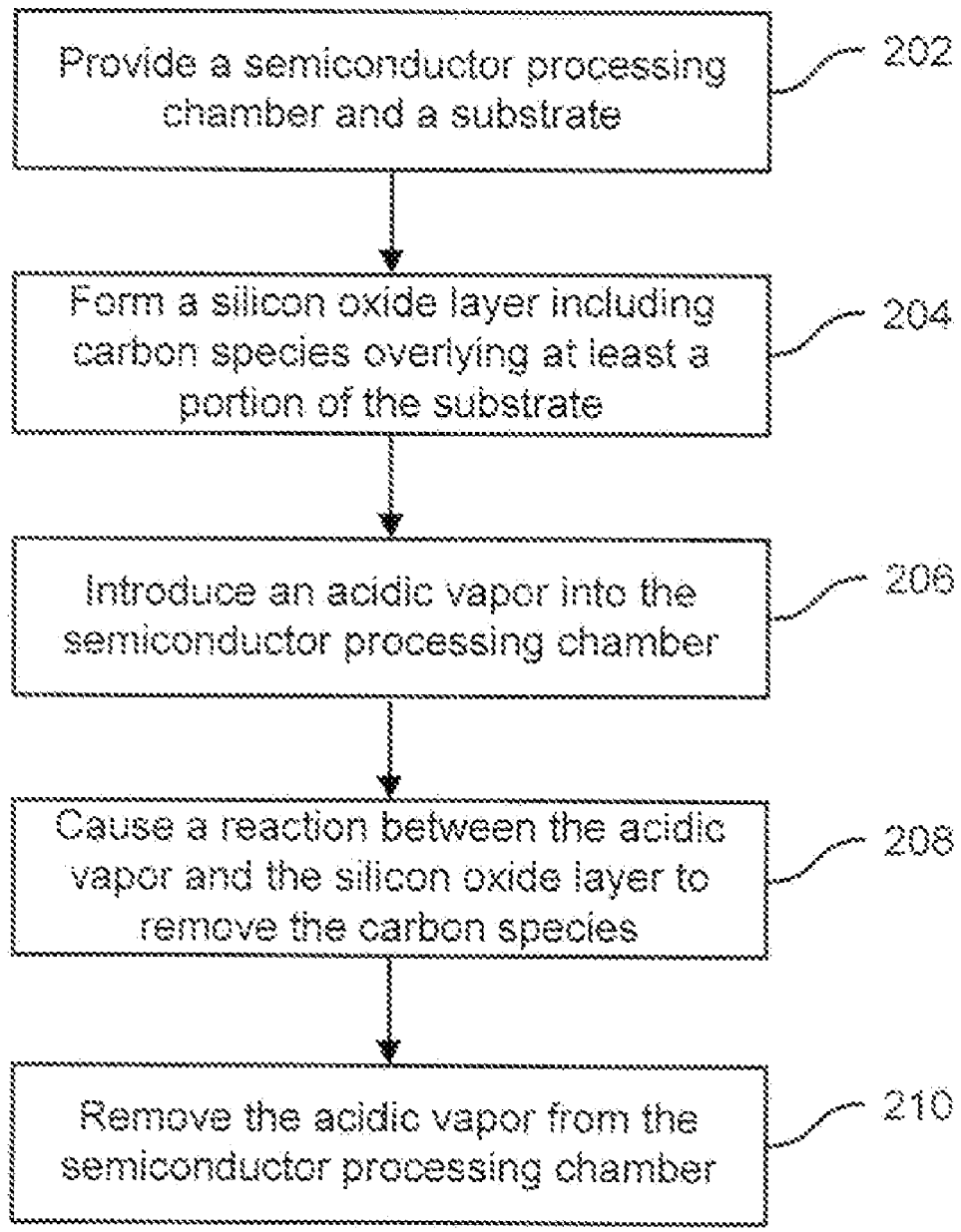
FIG. 2 is an exemplary flowchart showing a process flow for an silicon oxide curing process according to an exemplary embodiment of the present invention.

FIGS. 1A-1B are simplified exemplary cross-sections showing a series of processes used in a gap-fill deposition according to an exemplary embodiment of the present invention. For example, FIGS. 1A-1B may be viewed in conjunction with FIG. 2 which is an exemplary flowchart showing a process flow for an silicon oxide curing process according to an exemplary embodiment of the present invention. The method 200 includes first providing a semiconductor processing chamber (not shown) and substrate 100 in process 202. The substrate 100 may be a semiconductor wafer (e.g., a 200 mm, 300 mm, 400 mm, etc. silicon wafer) and may include structures, device components, etc., formed in earlier processes. In addition, the substrate may include gaps, trenches, etc., with high height to width aspect ratios (e.g., an aspect ratio of 5:1 or more, 6:1 or more, 7:1 or more, 8:1 or more, 9:1 or more, 10:1 or more, 11:1 or more, 12:1 or more, etc.). For example, substrate 100 includes trench 104 having sidewalls 106 and a bottom 108.

The method 100 also includes forming an silicon oxide layer 102 overlying at least a portion of substrate 100 in process 204. For example, silicon oxide layer 102 may be deposited using a flow-like CVD-based approach into a trench 104 using an organosilicate precursor 110 and atomic oxygen precursor 112 as described in co-assigned U.S. patent application by Ingle et al, and titled "CHEMICAL VAPOR DEPOSITION OF HIGH QUALITY FLOW-LIKE SILICON DIOXIDE USING A SILICON CONTAINING PRECURSOR AND ATOMIC OXYGEN", filed on May 30, 2006. Alternatively, a flowable dielectric layer may be formed with Si—Si bonds converted to Si—NH—Si bonds in a remote plasma CVD process, and expanding to Si—O—Si bonds to lead layer densification during a post-deposition steam annealing as described in co-assigned U.S. patent application by Mallick et al, and titled "HIGH QUALITY SILICON OXIDE FILMS BY REMOTE PLASMA CVD FROM DISILANE PRECURSORS", filed on May 30, 2006. However, other conventional methods of depositing an silicon oxide layer such as spin-on, SACVD, and HDP-CVD may also be used as well. In a specific embodiment of the invention, method 100 may be used for STI applications. For example, sidewalls 106 and bottom 108 of trench 104 are substantially covered by the formation of silicon oxide layer 110, which may extend from filling a partial depth of trench 104 to completely filling and extending over trench 104. As a result of its formation, silicon oxide layer 102 covers at least a portion of substrate 100.

As a result of formation process 204, silicon oxide layer 102 completely fills at least a portion of trench 104 with no voiding or seams. However, the use of a flowable deposition process 204 can result in a layer that is too porous and does not have an adequate mechanical strength. Thus, silicon oxide layer 102 may require treatment by the addition of an acidic vapor into the processing chamber in process 206.

In a specific embodiment, an acidic, aqueous vapor may be introduced in two methods: first, directly into the chamber as a dilute concentration of HCl (hydrogen chloride) gas with a siloxane precursor or through in situ generation of HCl or $CH_3COOH$ (acetic acid) by usage of a chloro-siloxane or acetoxy-siloxane, respectively. Chloro-siloxanes that can be used to generate HCl include dichlorodiethoxysiloxane (DCDES) and chlorotriethoxysiloxane (CTES). $CH_3COOH$ may be generated using an acetoxysiloxane such as diacetoxydi-tert-butylsilane. Of course, other methods of introducing the acidic vapor or utilizing different precursors or acids could also be used by those of skill in the art. Different process variables that can be used to control the chemical reaction include the water:acid ratio, pressure, temperature, and time of the acid vapor exposure to the silicon oxide layer. For example, use of a vapor that is composed of both acid and water may function more effectively than a vapor composed of pure acid. In addition, the water:acid ratio can range from 100:1 to 1:100, while the pressure can range from 10 mTorr to atmospheric pressure. The temperature used in the acid treatment process can range from 20 degrees C. to 600 degrees C. The time of exposure can range from as little as one second to 24 hours.

Figure 3:
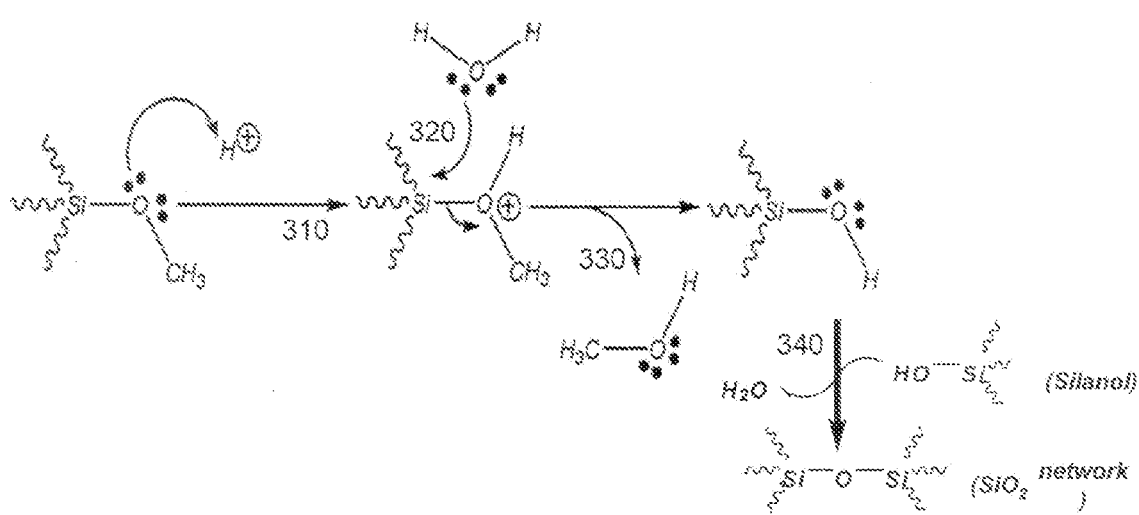
FIG. 3 is an exemplary drawing showing acid catalysis for removal of carbon-based species in an as-deposited dielectric film according to an exemplary embodiment of the present invention.

After introduction into semiconductor processing chamber, the acidic vapor reacts with silicon oxide layer 102 in process 208. While not being bound to a particular theory, it is believed that the addition of the acid helps catalyze the reaction of the organic moieties that are unreacted during deposition. For example the acidic environment can catalyze the removal of organic species ($CH_x$) present within silicon oxide layer 102. For example, FIG. 3 is an exemplary drawing showing acid catalysis for removal of carbon-based species in an as-deposited dielectric layer according to an exemplary embodiment of the present invention. This diagram is merely an example and should not unduly limit the scope of the claims herein. One of ordinary skill in the art would recognize other variations, modifications, and alternatives. When an acidic vapor is added during the treatment process, an unreacted hydroxyl group can experience an electrophilic attack of acid, i.e., an $H^+$ ion from the acid may turn an unreacted $CH_3O$ group into an reactive $CH_3OH$ group by taking one electron from the oxygen atom to the hydrogen atom. This is illustrated in the process 310 of FIG. 5. The water vapor then reacts with the reactive $CH_3OH$ group, as shown in process 320. The reaction results in the formation of a silanol Si—OH group and the release of the alcohol $CH_3OH$ molecule from the layer in process 330. The condensation of the formed silanol Si—OH groups (i.e., by releasing the water when combining two silanol Si—OH groups) leads to the formation of silicon oxide networks in the film in process 340. In one embodiment, the acid treatment can help to increase the film density by removal of carbon species and reduce the possibility of void formation through the loss of the hydroxyl groups. Of course, there can be other alternatives, variations, and modifications.

As shown in FIG. 1B, treated silicon oxide layer 116 may experience some shrinkage as the layer densifies and unfinished chemical reactions within the silicon oxide layer are completed. Acidic vapors 114 are removed from the semiconductor processing chamber in process 210. The vapors may be removed using a pumping mechanism integrated or separate from the semiconductor processing chamber. The resulting layer post-treatment is non-porous, dense, and of a higher mechanical strength than the as-deposited layer. Thus, a high-quality silicon oxide layer can be obtained while still maintaining the flowability characteristics necessary for high aspect ration gap fill processes.

Figure 4:
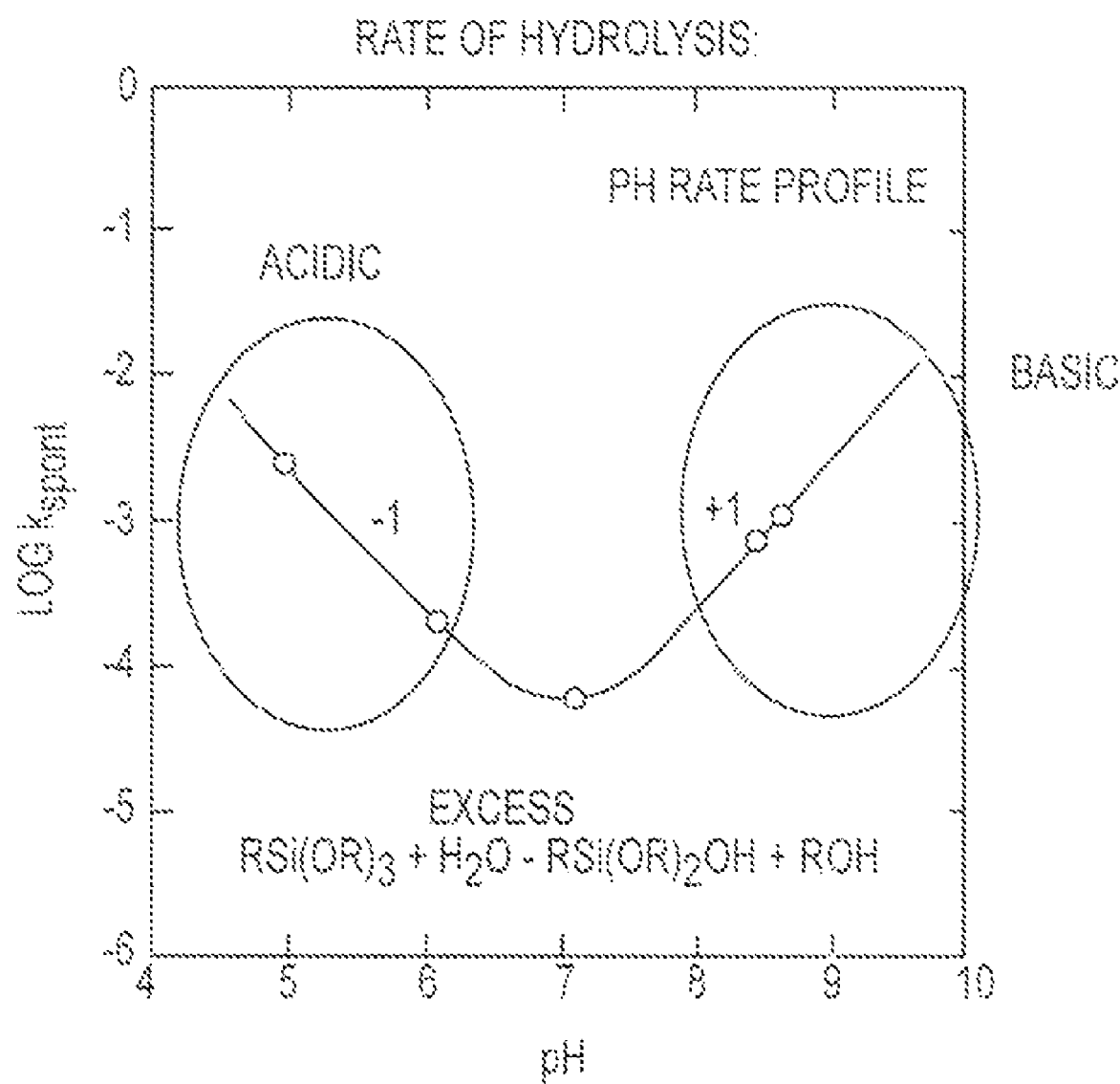
FIG. 4 is a chart showing the effect of introducing an acidic catalyst on the rate of hydrolysis according to an exemplary embodiment of the present invention.

FIG. 4 is a chart showing the effect of introducing an acidic catalyst on the rate of hydrolysis according to an exemplary embodiment of the present invention. While not being bound to a particular theory, it is believed that the addition of the acidic catalyst to the silicon oxide layers allows for the rate of hydrolysis to be increased, thus increasing the amount of Si—O—Si linkages and the quality of the layer.

Figure 5:
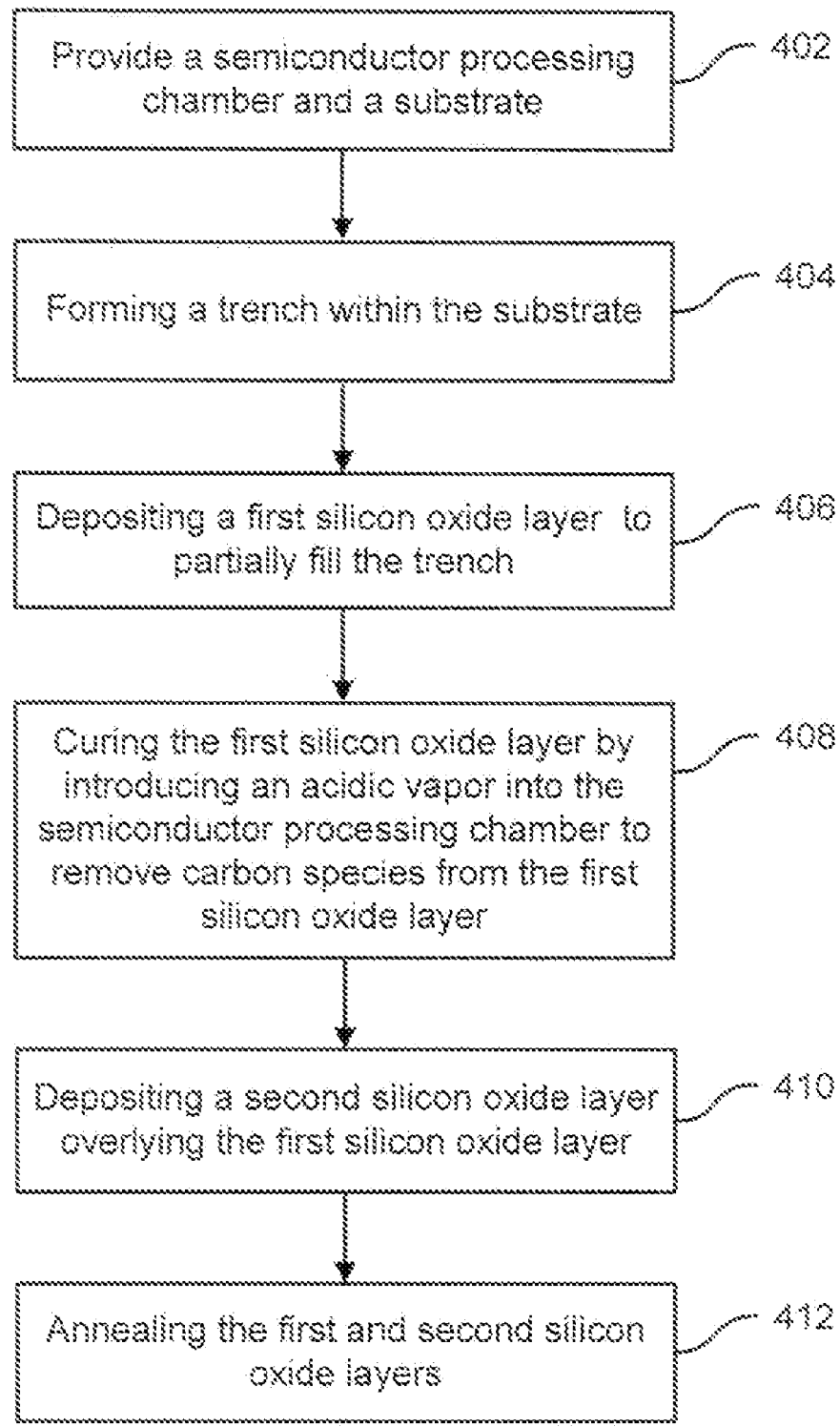
FIG. 5 is an exemplary flowchart showing a process flow for a gap-fill deposition according to an exemplary embodiment of the present invention.
Figure 6:
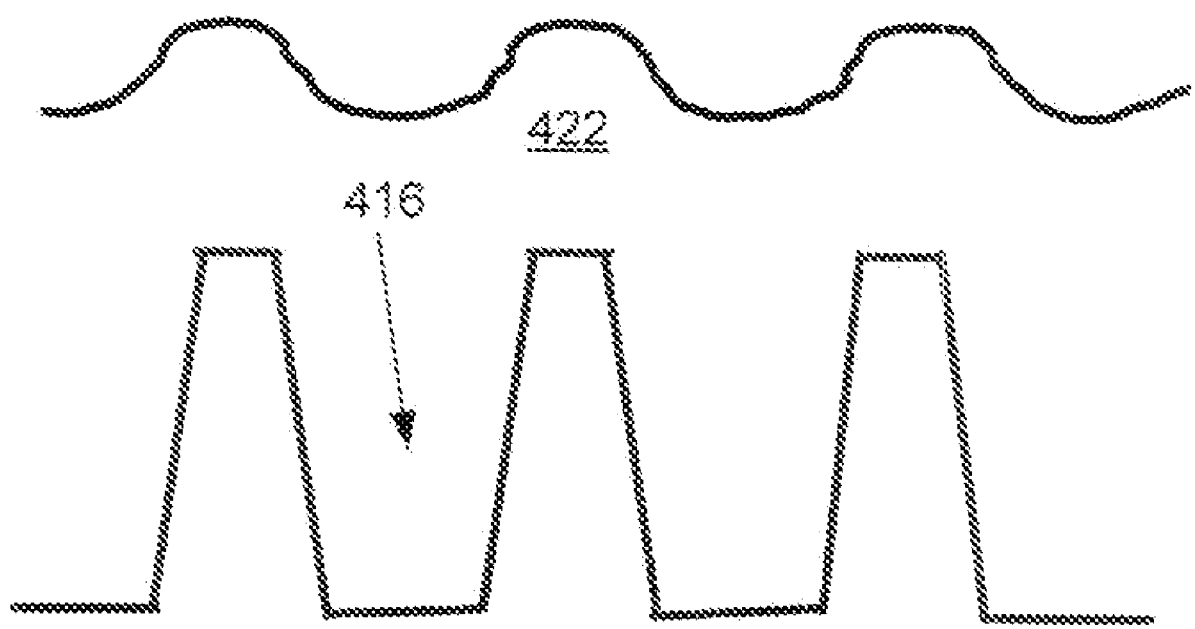
FIG. 6 is a simplified exemplary cross-section showing completion of a gap-fill deposition according to an exemplary embodiment of the present invention.

FIG. 5 is an exemplary flowchart showing a process flow for a gap-fill deposition according to an exemplary embodiment of the present invention. The method 400 may include similar processes as described previously in relation to FIG. 2, and a repeated discussion of those elements is omitted. In process 402, a semiconductor processing chamber and substrate are provided. The substrate may be a semiconductor wafer (e.g., a 200 mm, 300 mm, 400 mm, etc. silicon wafer) and may include structures, device components, etc., formed in earlier processes. In process 404, a trench is formed within the substrate using conventional processes. For example, the trench formed may be used for shallow trench isolation or for other processes as known to those of skill in the art. In process 406, a first silicon layer is deposited within the trench to partially fill the trench. The first silicon oxide layer may be deposited using a flowable deposition process as described previously, or performed using a conventional process. Following the deposition process, the first silicon oxide layer is cured by introducing an acidic, aqueous vapor into the semiconductor processing chamber in process 408. The vapor reacts with the silicon oxide layer to catalyze the reaction of the organic moieties that are unreacted during deposition. In process 410, a second silicon oxide layer is deposited overlying the first silicon oxide layer. For example, the second silicon oxide layer may substantially fill the trench partially filled by the first silicon oxide layer by utilizing a flowable deposition process. FIG. 6 is a simplified exemplary cross-section showing completion of a gap-fill deposition according to an exemplary embodiment of the present invention. In FIG. 6, silicon oxide layer 422 has completely filled trench 416 after the single or multiple deposition and treatment processes have been completed.

As a result of the flowable deposition process, an amorphous layer may be deposited that has flow-like characteristics due to the existence of hydroxyl groups in the molecular framework. In one embodiment, the method 400 further includes annealing the deposited layers in an oxidizing environment to form a dense silicon oxide layer in process 412. Upon a high-temperature anneal, hydroxyl groups including residual carbon and OH groups present within the deposited layers will react to decompose into water and/or alcohol vapors which are immediately pumped out, resulting in significant film shrinkage and densification. In a specific embodiment, annealing process 412 is a thermal anneal process in an oxidizing environment within a steam (water vapor) atmosphere. For example, the steam annealing can be performed at a substrate temperature from about 200° C. to about 1050° C. with the vapor pressure during anneal at about 1 Torr to about 760 Torr. In an alternative embodiment, the annealing process 412 is an ozone treatment with substrate held at room temperature up to 600° C. The Ozone treatment may further be incorporated with a UV light irradiation. In another alternative embodiment, the annealing process 412 is a film curing process involving molecular oxygen treatment from room temperature to 900° C. or atomic oxygen treatment from room temperature up to 600° C. Of course, one of skilled in the art would recognize many alternatives, variations, and modifications.

Figure 7:
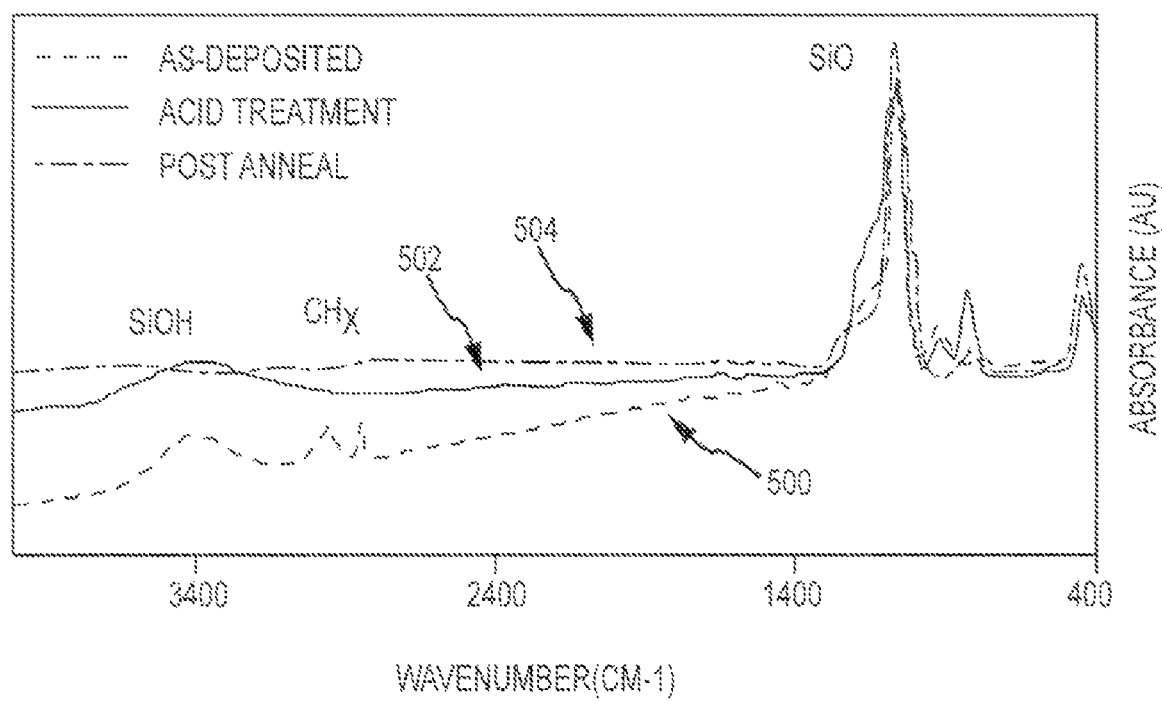
FIG. 7 is a FTIR comparison of a deposited film pre-acid treatment, post-acid treatment, and post-anneal according to an exemplary embodiment of the present invention.

FIG. 7 is a FTIR comparison of a deposited layer pre-acid treatment, post-acid treatment, and post-anneal according to an exemplary embodiment of the present invention. The vertical axis is proportional to the logarithm of light absorbed (absorbance), and the horizontal axis is the wave number (1/wavelength) of light passed through the sample material. For example, exemplary absorption spectrums 500, 502, and 504 correspond respectively to an as-deposited silicon layer pre-treatment, the deposited silicon layer post-treatment, and the deposited silicon layer after an anneal process. As illustrated with respect to absorption spectrum 500 for the as-deposited layer, the two sharp increases in absorbance at around 3400 and 2900, respectively, indicate the presence of SiOH and $CH_x$ molecules still present within the deposited layer. The addition of the acid catalyzes the removal of a significant amount of organic species around 2900 as shown in absorption spectrum 502. Amounts of SiOH are still present within the deposited silicon layer post-treatment in absorption spectrum 3400, but are subsequently removed after the anneal process, thus resulting in a high quality silicon oxide layer with Si—O—Si linkages.

Figure 8:
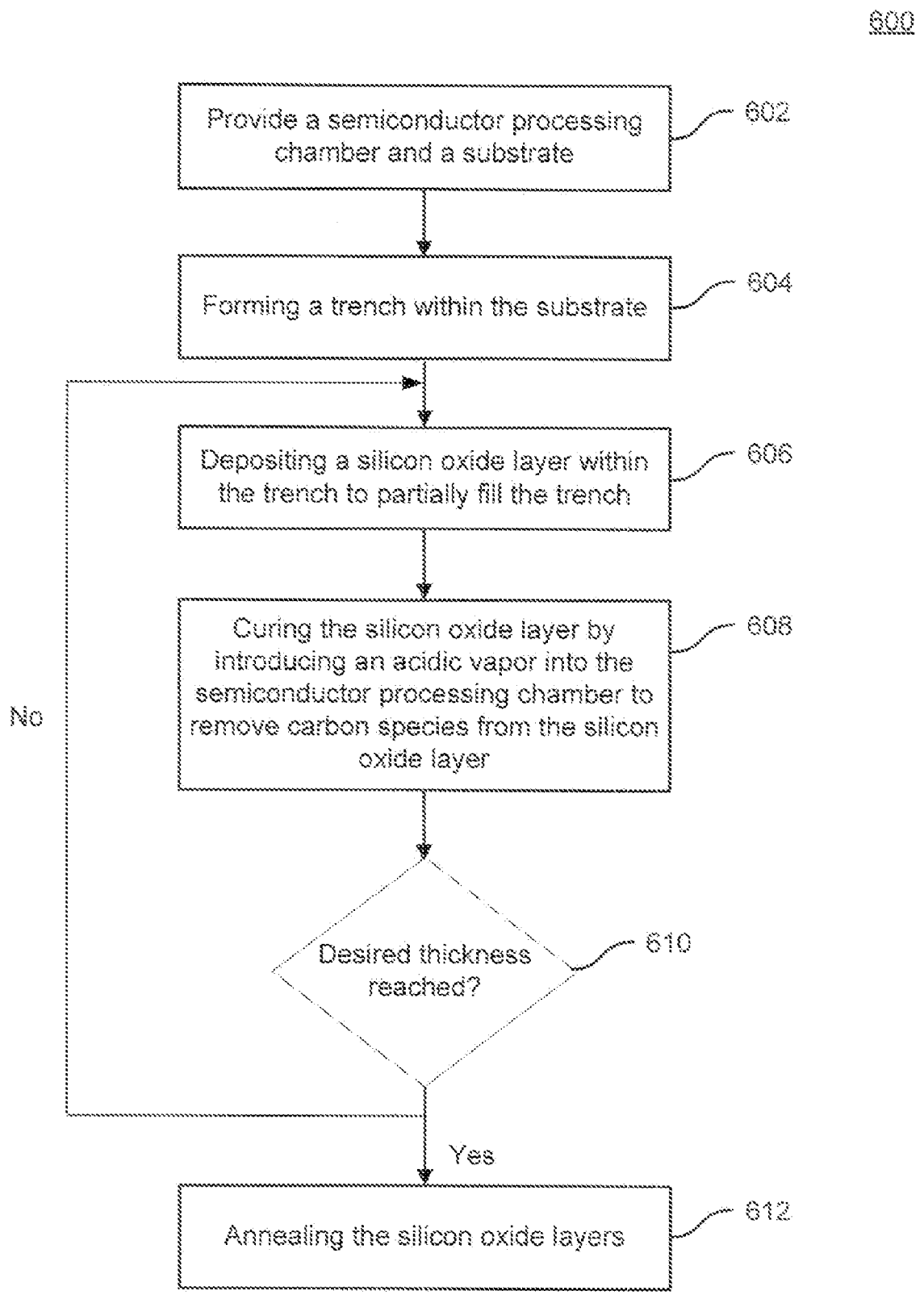
FIG. 8 is an exemplary flowchart showing an alternate process flow for a gap-fill deposition according to an exemplary embodiment of the present invention.

FIG. 8 is an exemplary flowchart showing an alternate process flow for a gap-fill deposition according to an exemplary embodiment of the present invention. The method 600 may include similar processes as described previously in relation to FIGS. 2 and 5, and a repeated discussion of those elements is omitted. In process 602, a semiconductor processing chamber and substrate are provided. The substrate may be a semiconductor wafer (e.g., a 200 mm, 300 mm, 400 mm, etc. silicon wafer) and may include structures, device components, etc., formed in earlier processes. In process 604, a trench is formed within the substrate using conventional processes. For example, the trench formed may be used for shallow trench isolation or for other processes as known to those of skill in the art. In process 606, a silicon layer is deposited within the trench to partially fill the trench. For example, the silicon layer may have a thickness between 5-500 Å. The silicon oxide layer may be deposited using a flowable deposition process as described previously, or performed using a conventional process. Following the deposition process, the silicon oxide layer is cured by introducing an acidic, aqueous vapor into the semiconductor processing chamber in process 608. The vapor reacts with the silicon oxide layers to catalyze the reaction of the organic moieties that are unreacted during deposition. After curing it is determined whether the desired thickness of the silicon oxide layer has been reached in process 610. If not, cycles of deposition and treatment are repeated until the target thickness is obtained. Afterwards, the silicon oxide layers are annealed to help densify the layers in process 414.

It should be appreciated that the examples of the methods shown and described in FIGS. 1-5 are just some of the many embodiments that may be used to cure an silicon oxide layer on a substrate according to the present invention. Additional embodiments may include additional steps, and different sequences of steps to treat or deposit the silicon oxide layer. In a specific embodiment of the invention, the semiconductor processing chamber can allow for delivery of different liquid precursors through different paths. This allows for deposition of the silicon oxide layer immediately followed by the treatment process within a single processing chamber. An exemplary processing chamber that can be used in conjunction with process 200 is described below in relation to FIGS. 9 and 10.

Exemplary Substrate Processing System

Deposition systems that may implement embodiments of the present invention may include high-density plasma chemical vapor deposition (HDP-CVD) systems, plasma enhanced chemical vapor deposition (PECVD) systems, sub-atmospheric chemical vapor deposition (SACVD) systems, and thermal chemical vapor deposition systems, among other types of systems. Specific examples of CVD systems that may implement embodiments of the invention include the CENTURA ULTIMA™ HDP-CVD chambers/systems, and PRODUCER™ PECVD chambers/systems, available from Applied Materials, Inc. of Santa Clara, Calif.

Figure 9:
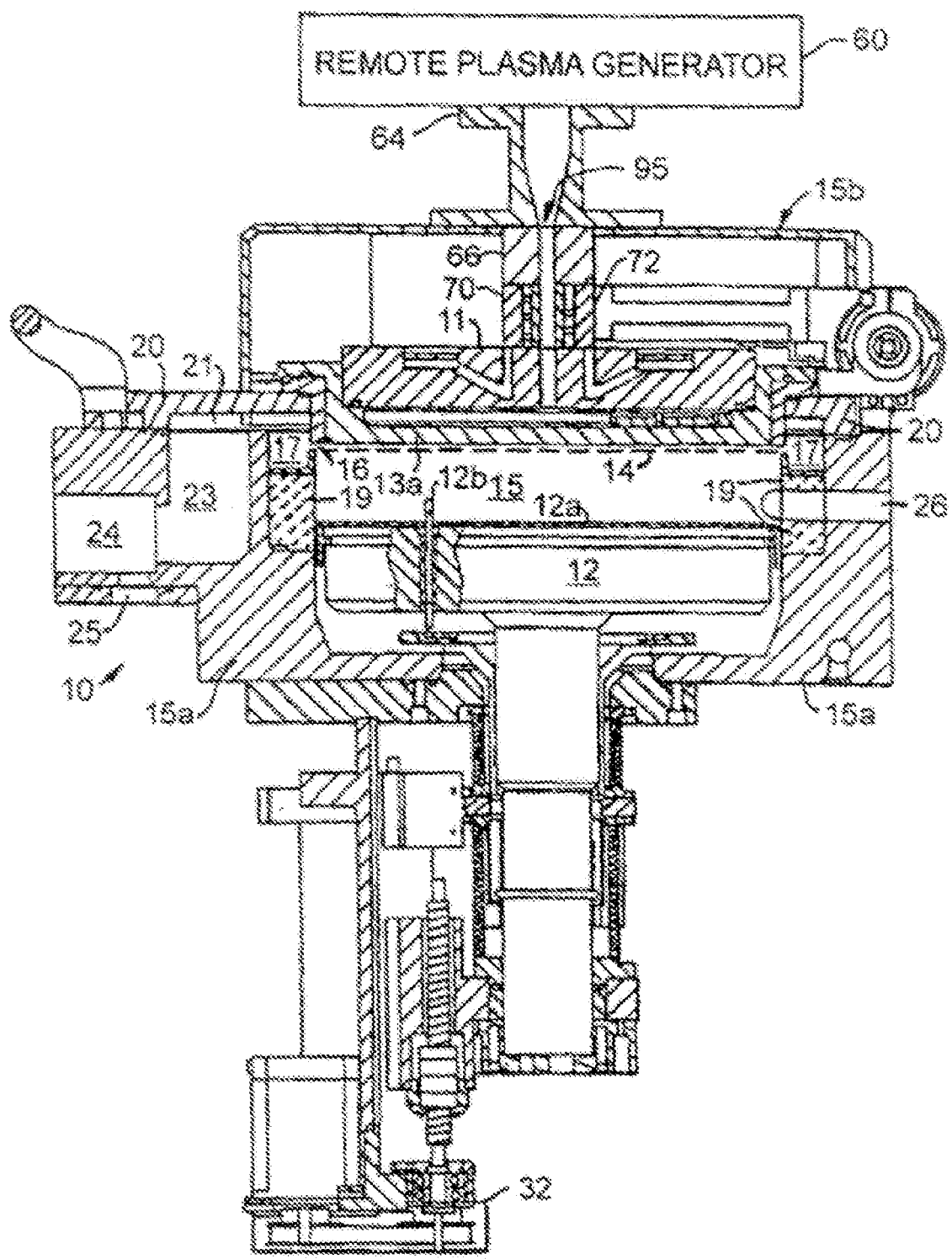
FIG. 9 shows a vertical cross-sectional view of a substrate processing system that may be used to form and treat silicon oxide layers according to embodiments of the invention.

One suitable substrate processing system in which can be modified to utilize embodiments in accordance with the present invention is shown and described in co-assigned U.S. Pat. Nos. 6,387,207 and 6,830,624, which are incorporated herein by reference for all purposes. FIG. 9 is vertical, cross-sectional views of a CVD system 10, having a vacuum or processing chamber 15 that includes a chamber wall 15a and a chamber lid assembly 15b.

The CVD system 10 contains a gas distribution manifold 11 for dispersing process gases to a substrate (not shown) that rests on a heated pedestal 12 centered within the process chamber 15. Gas distribution manifold 11 may be formed from an electrically conducting material in order to serve as an electrode for forming a capacitive plasma. During processing, the substrate (e.g. a semiconductor wafer) is positioned on a flat (or slightly convex) surface 12a of the pedestal 12. The pedestal 12 can be moved controllably between a lower loading/off-loading position (depicted in FIG. 9) and an upper processing position (indicated by dashed line 14 in FIG. 9), which is closely adjacent to the manifold 11. A centerboard (not shown) includes sensors for providing information on the position of the wafers.

Deposition and carrier gases are introduced into the chamber 15 through perforated holes 13b of a conventional flat, circular gas distribution faceplate 13a. More specifically, deposition process gases flow into the chamber through the inlet manifold 11, through a conventional perforated blocker plate 42 and then through holes 13b in gas distribution faceplate 13a.

Before reaching the manifold 11, deposition and carrier gases are input from gas sources 7 through gas supply lines 8 into a mixing system 9 where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in the CVD system 10 can be either a thermal process or a plasma-enhanced process. In a plasma-enhanced process, an RF power supply 44 applies electrical power between the gas distribution faceplate 13a and the pedestal 12 so as to excite the process gas mixture to form a plasma within the cylindrical region between the faceplate 13a and the pedestal 12. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15. In a thermal process, the RF power supply 44 would not be utilized, and the process gas mixture thermally reacts to deposit the desired films on the surface of the semiconductor wafer supported on the pedestal 12, which is resistively heated to provide thermal energy for the reaction.

During a plasma-enhanced deposition process, the plasma heats the entire process chamber 10, including the walls of the chamber body 15*a* surrounding the exhaust passageway 23 and the shut-off valve 24. When the plasma is not turned on or during a thermal deposition process, a hot liquid is circulated through the walls 15*a* of the process chamber 15 to maintain the chamber at an elevated temperature. The passages in the remainder of the chamber walls 15*a* are not shown. Fluids used to heat the chamber walls 15*a* include the typical fluid types, i.e., water-based ethylene glycol or oil-based thermal transfer fluids. This heating (referred to as heating by the "heat exchanger") beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction byproducts, is evacuated from the chamber 15 by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15*a* (including the upper dielectric lining 19 on the wall) and the bottom of the circular chamber lid 20. The 360.degree. circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15*a*), and into the exhaust outlet 25 that connects to the external vacuum pump (not shown) through a foreline (also not shown).

The wafer support platter of the pedestal 12 (preferably aluminum, ceramic, or a combination thereof) is resistively heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum, anodized aluminum, or ceramic. An example of such a CVD apparatus is described in co-assigned U.S. Pat. No. 5,558,717 entitled "CVD Processing Chamber," issued to Zhao et al, and hereby incorporated by reference in its entirety.

A lift mechanism and motor 32 (FIG. 9) raises and lowers the heater pedestal assembly 12 and its wafer lift pins 12*b* as wafers are transferred into and out of the body of the chamber 15 by a robot blade (not shown) through an insertion/removal opening 26 in the side of the chamber 10. The motor 32 raises and lowers pedestal 12 between a processing position 14 and a lower, wafer-loading position. The motor, valves or flow controllers connected to the supply lines 8, gas delivery system, throttle valve, RF power supply 44, and chamber and substrate heating systems are all controlled by a system controller over control lines 36, of which only some are shown. Controller 34 relies on feedback from optical sensors to determine the position of movable mechanical assemblies such as the throttle valve and susceptor which are moved by appropriate motors under the control of controller 34.

In the exemplary embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, the memory 38 is a hard disk drive, but the memory 38 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 34.

A process for depositing a film on a substrate or a process for cleaning the chamber 15 can be implemented using a computer program product that is executed by the controller 34. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

Figure 10:
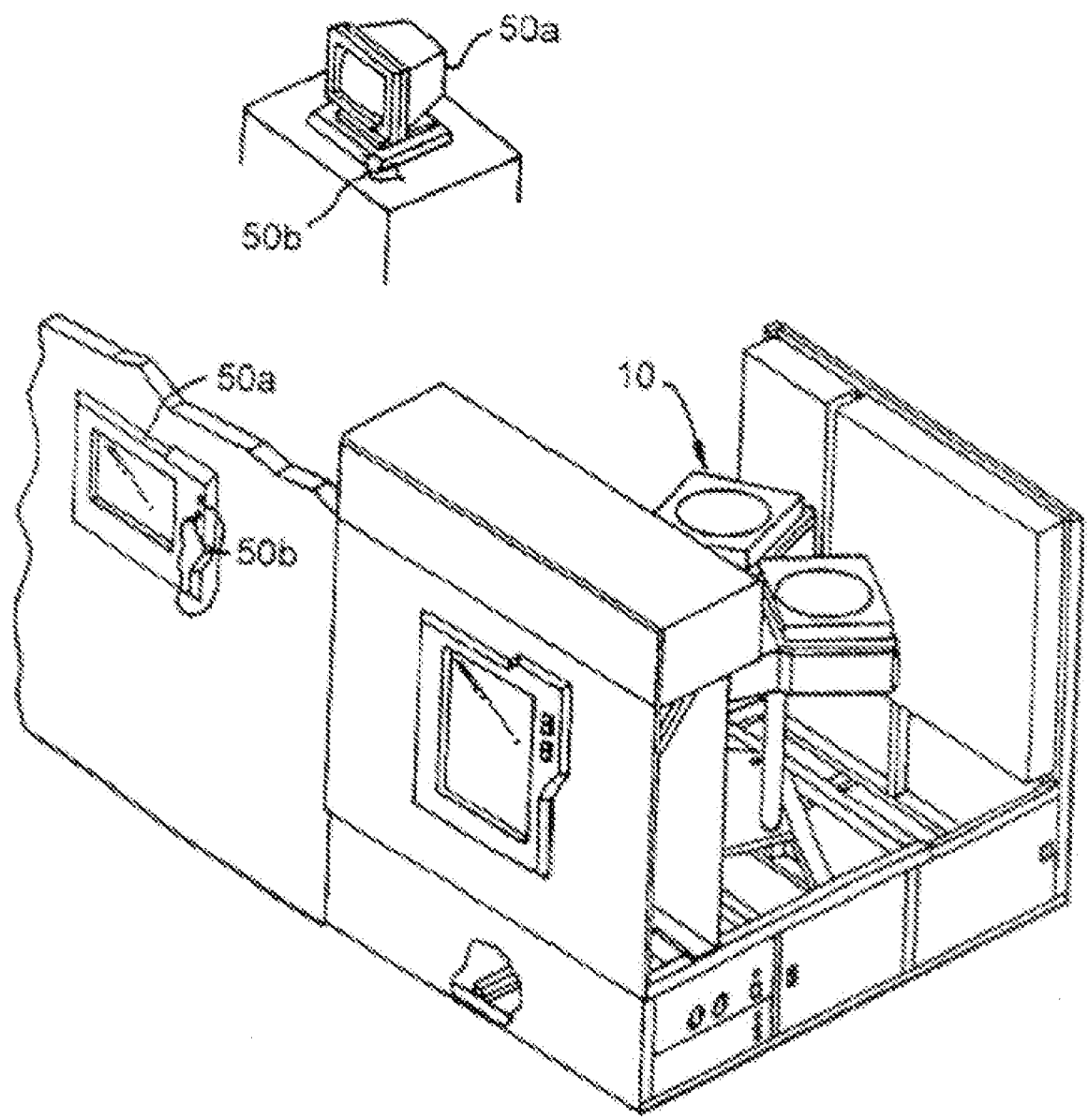
FIG. 10 is a simplified diagram of a system monitor/controller component of a substrate processing system according to embodiments of the invention.

The interface between a user and the controller 34 is via a CRT monitor 50*a* and light pen 50*b*, shown in FIG. 10, which is a simplified diagram of the system monitor and CVD system 10 in a substrate processing system, which may include one or more chambers. In the preferred embodiment two monitors 50*a* are used, one mounted in the clean room wall for the operators and the other behind the wall for the service technicians. The monitors 50*a* simultaneously display the same information, but only one light pen 50*b* is enabled. A light sensor in the tip of light pen 50*b* detects light emitted by CRT display. To select a particular screen or function, the operator touches a designated area of the display screen and pushes the button on the pen 50*b*. The touched area changes its highlighted color, or a new menu or screen is displayed, confirming communication between the light pen and the display screen. Other devices, such as a keyboard, mouse, or other pointing or communication device, may be used instead of or in addition to light pen 50*b* to allow the user to communicate with controller 34.

FIG. 9 shows a remote plasma generator 60 mounted on the lid assembly 15b of the process chamber 15 including the gas distribution faceplate 13a and the gas distribution manifold 11. A mounting adaptor 64 mounts the remote plasma generator 60 on the lid assembly 15b, as best seen in FIG. 9. The adaptor 64 is typically made of metal. A mixing device 70 is coupled to the upstream side of the gas distribution manifold 11 (FIG. 9). The mixing device 70 includes a mixing insert 72 disposed inside a slot 74 of a mixing block for mixing process gases. A ceramic isolator 66 is placed between the mounting adaptor 64 and the mixing device 70 (FIG. 9). The ceramic isolator 66 may be made of a ceramic material such as $Al_2O_3$ (99% purity), Teflon®, or the like. When installed, the mixing device 70 and ceramic isolator 66 may form part of the lid assembly 15b. The isolator 66 isolates the metal adaptor 64 from the mixing device 70 and gas distribution manifold 11 to minimize the potential for a secondary plasma to form in the lid assembly 15b as discussed in more detail below. A three-way valve 77 controls the flow of the process gases to the process chamber 15 either directly or through the remote plasma generator 60.

The remote plasma generator 60 is desirably a compact, self-contained unit that can be conveniently mounted on the lid assembly 15b and be easily retrofitted onto existing chambers without costly and time-consuming modifications. One suitable unit is the ASTRON® generator available from Applied Science and Technology, Inc. of Woburn, Mass. The ASTRON® generator utilizes a low-field toroidal plasma to dissociate a process gas. In one example, the plasma dissociates a process gas including a fluorine-containing gas such as $NF_3$ and a carrier gas such as argon to generate free fluorine which is used to clean film deposits in the process chamber 15.

Having described several embodiments, it will be recognized by those of skill in the art that various modifications, alternative constructions, and equivalents may be used without departing from the spirit of the invention. For example, additional methods of treating a deposited dielectric layer (e.g., silicon oxide layer) may be used in addition to (or in lieu of) acid vapor treatment. These may include thermal annealing, UV curing, UV curing with water vapor, plasma curing (e.g., induced-coupled plasma curing), and e-beam curing, among other techniques. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of forming a silicon oxide layer on a substrate, the method comprising:
   providing a semiconductor processing chamber and a substrate;
   forming a trench within the substrate;
   depositing a first silicon oxide layer to partially fill the trench;
   curing the first silicon oxide layer by introducing an acidic vapor into the semiconductor processing chamber, the acidic vapor reacting with the first silicon oxide layer to remove carbon species from the first silicon oxide layer;
   depositing a second silicon oxide layer overlying the first silicon oxide layer, the second silicon oxide layer substantially filling the trench; and
   annealing the first and the second silicon oxide layers.

2. The method of claim 1 wherein the first silicon oxide layer that includes the carbon species is a flowable silicon oxide layer.

3. The method of claim 1 further comprising annealing the silicon oxide layer subsequent to the introduction of the acidic vapor into the semiconductor processing chamber in order to increase density of the silicon oxide layer.

4. The method of claim 1 wherein the silicon oxide layer is deposited using an alkoxysilane process.

5. The method of claim 1 wherein the silicon oxide layer is deposited using a plasma CVD process.

6. The method of claim 1 wherein introducing an acidic vapor further comprises flowing HCl gas into the semiconductor processing chamber.

7. The method of claim 6 wherein the HCl gas is flowed with a siloxane precursor.

8. The method of claim 1 wherein introducing an acidic vapor further comprises in situ generation of HCl or $CH_3COOH$.

9. The method of claim 8 wherein the in situ generation of HCl or $CH_3COOH$ is performed using chloro-siloxane or acetoxy-siloxane.

10. The method of claim 9 wherein the chloro-siloxane is selected from the group comprising dichlorodiethoxysiloxane or chlorotriethoxysiloxane.

11. The method of claim 9 wherein the acetoxy-siloxane is diacetoxydi-tert-butylsilane.

12. The method of claim 1 wherein the acidic vapor catalyzes the removal of an alkoxyl group from an organo-silicon compound in the silicon oxide layer to leave a silanol moiety.

13. The method of claim 1 wherein the vapor is a mixture of acid and water having a water to acid ratio.

14. The method of claim 13 wherein the water to acid ratio is about 100:1 to about 1:100.

15. The method of claim 1 wherein the reaction between the acidic vapor and silicon oxide layer is performed between 10 mTorr to atmospheric pressure.

16. The method of claim 1 wherein the reaction between the acidic vapor and silicon oxide layer is performed between 60° C. and 600° C.

17. The method of claim 1 wherein a plurality of structures are formed on a surface of the substrate, wherein the structures include gaps and trenches having height to width aspect rations of 7:1 or more.

18. A method of forming a silicon oxide layer on a substrate, the method comprising the processes of:
   (a) providing a substrate and a semiconductor processing chamber;
   (b) forming a trench within the substrate;
   (c) depositing a silicon oxide layer within the trench;
   (d) curing the silicon oxide layer by introducing an acidic vapor into the semiconductor processing chamber, the acidic vapor reacting with the silicon oxide layer to remove carbon species from the silicon oxide layer;
   (e) repeating processes (c) and (d) until a desired thickness of silicon oxide is formed within the trench; and
   (f) annealing the silicon oxide layers.

19. The method of claim 18 wherein the desired thickness of the silicon oxide layer is between 5 Å and 500 Å.

20. The method of claim 18 wherein the desired thickness of silicon oxide substantially fills the trench.

* * * * *